United States Patent [19]

Hutson

[11] Patent Number: 4,713,832

[45] Date of Patent: Dec. 15, 1987

[54] PROGRAMMABLE DIVIDER UP/DOWN COUNTER WITH ANTI-ALIASING FEATURE AND ASYNCHRONOUS READ/WRITE

[75] Inventor: John Hutson, Palo Alto, Calif.

[73] Assignee: Ampex Corporation, Redwood City, Calif.

[21] Appl. No.: 851,063

[22] Filed: Apr. 11, 1986

[51] Int. Cl.[4] .................... H03K 23/66; H03K 21/40
[52] U.S. Cl. ........................................ 377/45; 377/39; 377/52; 377/51
[58] Field of Search .................. 377/45, 39, 107, 110, 377/51, 52

[56] References Cited

U.S. PATENT DOCUMENTS

| | | | |
|---|---|---|---|
| 3,683,345 | 8/1972 | Faulkes et al. | 377/39 |
| 4,503,549 | 3/1985 | Slabinski | 377/39 |
| 4,509,044 | 4/1985 | Yachida | 377/39 |

Primary Examiner—John S. Heyman
Attorney, Agent, or Firm—Ronald C. Fish; Bradley A. Perkins; Richard P. Lange

[57] ABSTRACT

There is disclosed herein an up/down counter with a programmable terminal count. The up/down counter has a two level input structure such that new terminal counts may be written into the up/down counter asynchronously without disturbing operations of the up/down counter. Although the invention is described in the bidirectional sense, certain of the features are also applicable to unidirectional counters.

25 Claims, 4 Drawing Figures

PROGRAMMABLE DIVIDER UP/DOWN COUNTER WITH ANTI-ALIASING FEATURE AND ASYNCHRONOUS READ/WRITE

BACKGROUND OF THE INVENTION

The invention pertains to the field of up/down counters, and, more specifically, relates to the field of up/down counters with flexible operation features such as programmable divider, anti-aliasing capability for servo applications and asynchronous read and write capabilities.

In many applications, it is useful to have an up/down counter where the modulo number or the highest count the counter will reach before resetting to zero (hereafter the "terminal count") is programmable. Such a counter is a divide-by-n divider where n is programmable. Such counters are useful in electromechanical systems where the phase or timing relationships between various electrical and/or mechanical events must be measured. It is useful in many such applications to be able to program the counter to count up to a certain terminal count and then reset to zero or to count down from this terminal count and then reset to the current terminal count. Further, it is useful to be able to change the terminal count asynchronously such that when the current terminal count is reached (or zero is reached), the new terminal count is substituted as the current terminal count and the size of the counter's "loop", i.e., the numbers between zero and the terminal count, is changed.

Further, in applications such as servo applications where a microprocessor or other slow circuitry is involved in the reading process to read the current count and convert the count to a phase difference or error signal, it is useful to be able to asynchronously read the current count. This means, it is useful to take a "snapshot" of the current count at the time of the second event whose phase difference or error from the first event is to be determined, and then to read the count as it existed at the time of the snapshot at some later time when the microprocessor is ready.

It is also useful to be able to change directions of counting on the fly, i.e., without interrupting the count. This provides greater flexibility in designing systems with up/down counting needs. Further, it is useful to be able to disable the comparison to the terminal count with a control signal so that the counter will count past the terminal count to the maximum count which can be represented with the number of bits in the counter and then allow the counter to reset to zero.

In some servo system applications, it is possible for the two events to get extremely far out of phase. In such systems, if an up/down counter is used which can roll over to zero or the maximum count upon reaching the limit of its terminal count loop, "aliasing" can occur. Aliasing occurs if two events being measured are so far out of phase or are separated so far in time that the maximum possible count of the counter is exceeded and some additional counting is done before the second event occurs. In such a situation, for example, the maximum count which can be counted before rollover might be 100, but the two events are separated in time by 110 counts. The counter would count to 10 before the second event occurred after the rollover. The control circuitry that read the count and generated an error signal therefrom would think the two events were only 10 counts out of phase instead of 110 counts out of phase.

It is useful in such situations to have an input signal which can be asserted in situations where aliasing might occur to prevent the rollover. In such a counter, the maximum count or zero would be reached, and no rollover to zero or the maximum count would occur when the signal was asserted.

Thus, a need has arisen for an up/down counter with a programmable modulus and flexibility in its operating modes.

SUMMARY OF THE INVENTION

In accordance with the invention, a counter is provided which fills all the above needs. In one embodiment of the invention, an up/down counter and a two level input latch structure combine with a comparator and associated control logic to allow counting up to a terminal count stored by the user in the input latch structure, or down from the terminal count to zero. At any time the user may write a new terminal count into one level of the two level input latch, and upon the count making a transition through either the current terminal count or through zero, the new terminal count will be loaded into the second level of the input latch and will define the bounds of the new loop in which the counter counts. That is, the new terminal count may be written into the input latch structure asynchronously with the count, and no disturbance to the counting process will result.

This is accomplished by having the two level input latch coupled to data input buffers and read/write control logic such that at any time the user may write a new terminal count into the first level of the input latch. The second level of the input latch is connected to the output of the first level of the latch, and has its output coupled to a preset input of the counter and to one input of a comparator. The other input of the comparator is coupled to the count output of the counter. The second level of the input latch stores the current terminal count, and the comparator constantly compares the current count to the current terminal count. When the current count equals the current terminal count, the comparator outputs a control signal to control logic which causes the count to be cleared to zero and causes a terminal count output signal to be generated on the next up count if another control signal to be described later (Max-Min) is not asserted. The generation of the terminal count output signal also causes other logic to generate a signal which causes the first level of the input latch to load the new terminal count, regardless of whether it has changed from the current terminal count, into the second level latch. This new terminal count then becomes the current terminal count, and controls the greatest number to which the counter will count before it resets to zero.

There is also logic which receives the count pulses and a direction signal from the user. This logic latches the state of the direction signal on every rising edge of the count signal, and steers the count pulses to the correct count up or count down input of the counter. Thus the direction of the count may be changed on the fly, i.e., the direction can be changed on every occurrence of the count pulse.

When counting down, the counter generates a borrow signal when the count reaches zero. This borrow signal is received by reload logic and causes the contents of the first level of the input latch structure to be simultaneously loaded into the second level of the input latch and into the counter as the current count. If the counter continues to count down, further counting down will commence from the new terminal count which was loaded into the counter and into the second level of the input latch when the count reached zero.

The counter apparatus also provides logic for an asynchronous read operation to access the current count at any time without disturbing the counting process. When the user wishes to take a "snapshot" of the current count, a latch signal to the counter apparatus is activated. This latch signal causes the current count to be latched into a snapshot register. Later when the count at the time of the latch signal activation is to be read, the read/write control logic may be controlled by the user to enable the snapshot register to output its contents on the input/output data bus. Interlock logic prevents the snapshot register from being enabled when the latch signal is active and new data is being loaded into the snapshot register.

The counter apparatus further provides, in some embodiments, logic for allowing the comparator to be disabled such that the counter will count past the current terminal count and will count to the maximum count possible before resetting to zero. This logic is activated by the user by assertion of a bypass signal. When this signal is active, the counter, in the count down mode, will count down to zero and reset to the new terminal count then stored in the first level of the input latch structure.

The counter apparatus also provides logic by which aliasing in servo systems using the counter apparatus may be avoided. Aliasing is prevented by the assertion of a control signal max-min which causes the reload and clear logic to not perform their normal functions when the current count reaches the value of the current terminal count or zero. That is, when the current count reaches the current terminal count, the count stays at the current terminal count and is not reset to zero. When the current count reaches zero, the count stays at zero and no loading of the new terminal count from the first level of the input latch structure into the preset input of the up/down counter from the first level of the input latch structure into the preset input of the up/down counter occurs when the max-min signal is active.

DETAILED DESCRIPTION OF THE PREFERRED EMBODIMENT

Figure 1:
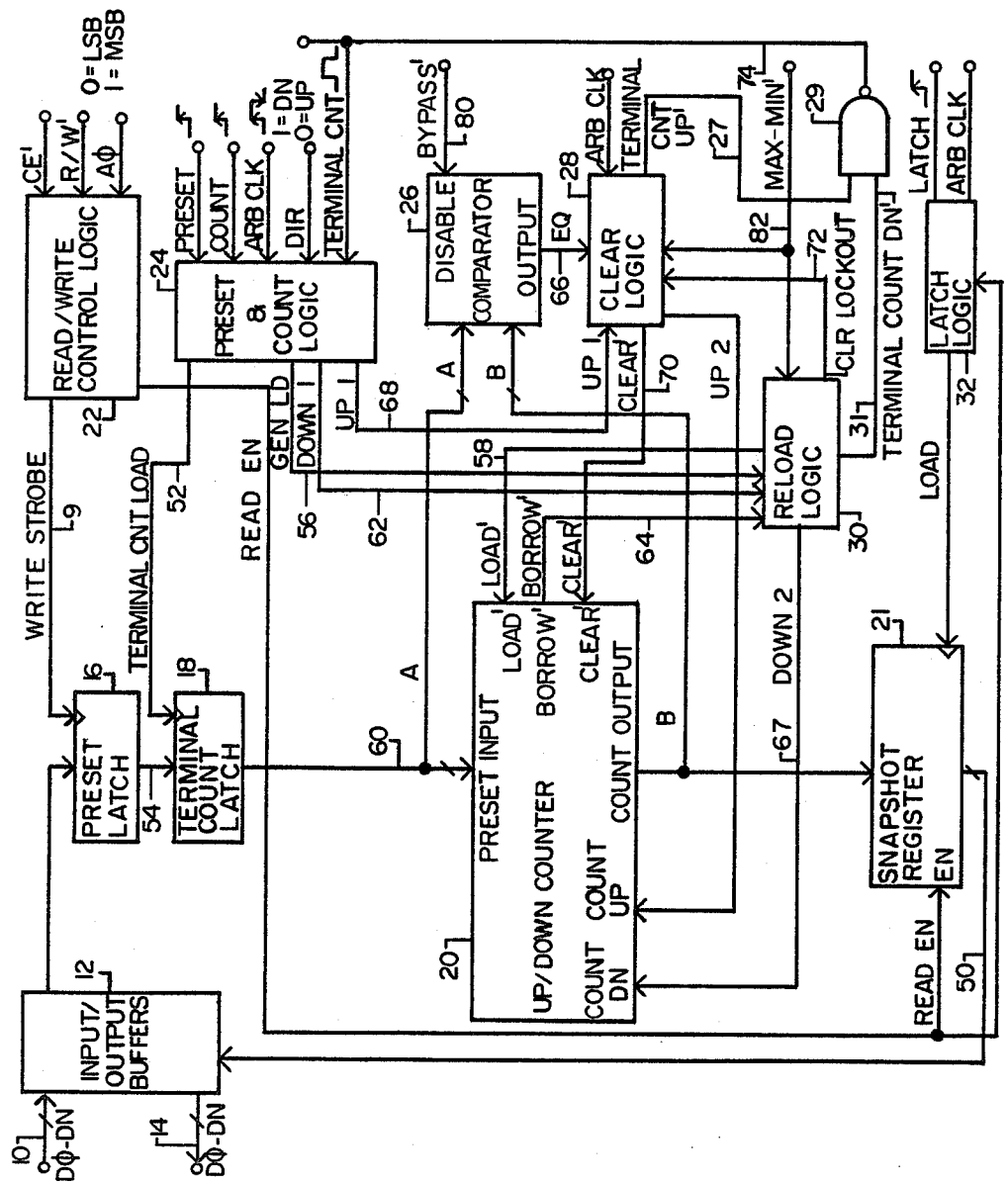
FIG. 1 is a block diagram of the counter apparatus of the invention.

Referring to FIG. 1, there is shown a block diagram of the counter apparatus of the invention. New terminal count numbers are supplied to the counter on the data bus 10 coupled to the input/output buffers 12. The current count is output on the data bus 14 after it has been latched into a snapshot register 21. In the preferred embodiment, the counter apparatus is implemented on a gate array, and only 8 pins are used for the data buses 10 and 14. That is, the data buses 10 and 14 are actually a single, bidirectional bus. The internal latches and the counter are 16 bits wide in the preferred embodiment, so the input and output transactions must be in two phases which will be explained further below. In other embodiments where the number of pins available for I/O operations equals the number of bits in the latches and the counter, the complications of two phase input and output are avoided.

A two level input structure is comprised of a preset latch 16 and a terminal count latch 18. The preset latch stores the new terminal count numbers input by the user. Data is written into the preset latch 16 by properly activating several control signals coupled to read/write control logic 22. These control signals are: CE' which enables the chip for I/O operations when it is low: R/W' which controls by its state whether an input or an output operation is performed; and the signal 'A zero' which is only used on embodiments where the number of I/O pins on the data bus or buses is ½ the number of bits in the preset latch. In such embodiments, the 'A zero' signal control whether data is input or output into or out of the most significant byte or the least significant byte of either the preset latch 16 or the snapshot register 21. The terminal count latch 18 stores the current terminal count number which defines the size of the loop for the up/down counter 20. The terminal count latch 18 is loaded from the preset latch under certain conditions to be described below in a section describing the operation of the system and only at certain times of an arbitration clock which is input to the system as the ARB CLK signal to preset and count logic 24. The arbitration clock is a square wave clock signal which is used to define two time slots on every cycle of the clock where certain events in the system are allowed to happen. During the time when the arbitration clock is high, latching of new data or the current count may occur. During times when the arbitration clock is low, counting by the counter 20 may occur.

The counter 20 may be any up/down counter which may be loaded with a preset number, which generates a borrow output signal when its count reaches zero, and which can count at a rate of at least half as fast as the arbitration clock frequency. Further requirements for the counter 20 are that its propagation delay from arrival of a count pulse at either its count up or count down inputs to the stabilization of the new count at its count output must be no more than ½ the arbitration clock cycle time. Further, the counter 20 must be capable of being cleared to zero at any time and such that the counter automatically clears to zero when it reaches the maximum count which may be represented by the number of bits in the counter.

The preset and count logic 24 receives various control signals and causes various events to occur in response thereto. A PRESET control signal causes the preset and control logic to generate the proper signals to cause the new terminal count stored in the preset latch 16 to be simultaneously transferred into the terminal count latch 18 and loaded into the counter 20 as the new current count. A COUNT control signal and a DIR or direction control signal cause counting to occur in the direction indicated by the DIR signal logic state. That is, the preset and count logic 24 latches the COUNT signal upward transitions, synchronizes them with the proper phase of the arbitration clock signal ARB CLK and steers the resultant upward signal transitions to the proper count up or count down input of the counter 20 in accordance with the state of the DIR signal. A TERMINAL COUNT signal is generated by the counter system itself every time the counter 20 counts down through zero to the maximum count or counts up through the current terminal count and resets to zero (when MAX-MIN is not asserted as will become clear later). This TERMINAL COUNT signal is also received by the preset logic 24. This TERMINAL COUNT signal causes the preset logic 24 to generate the proper signals to cause the new terminal count to be transferred from the preset latch 16 to the terminal count latch 18 and to be simultaneously loaded into the counter 20 as the new current count.

A comparator 26 serves to compare the current count output of the counter 20 to the current terminal count stored in the terminal count latch 18 and generate a signal indicating whether at any particular time these two numbers are equal. This comparator output signal EQ is coupled to clear logic 28 which generates a CLEAR signal when the current count becomes equal to the current terminal count. This CLEAR' (a prime mark on any signal name indicates it is active low) signal is coupled to an input of the counter 20, and, when activated, causes the counter to reset to zero. The clear logic 28 also generates the TERMINAL COUNT UP' signal on line 27 when the counter is cleared. This TERMINAL COUNT UP' signal is converted to the TERMINAL COUNT output signal on line 74 by the nand gate 29. The other input to the nand gate 29 is a TERMINAL COUNT DN' signal on a line 31 which is normally high and active low when the counter counts down to zero.

The counter must be reloaded with the new terminal count as the current count when the counter counts down to zero. This is the main function of the reload logic 30. The reload logic 30 also receives the MAX-MIN' control signal from the user and implements the function called for by this signal. When this signal is active low, the counter 20 counts up to the current terminal count and then stops or counts down to zero and stops. This is an anti-aliasing feature of the invention. When stopped at either count, if the direction of the count is reversed, counting will again resume. In other words counting can proceed indefinitely within the bounds of the loop established by zero and the current terminal count.

Latch logic 32 receives a LATCH control signal indicating that at the time of the upward transition of LATCH (as reclocked with the proper phase of the ARB CLK signal) that the current count is to be stored in the snapshot register 21. The latch logic 32 generates the proper load signals which, when coupled with an enable signal from the read/write control logic 22, causes the desired latching to occur whenever LATCH is active, and the snapshot register 21 is not enabled for loading with the current count from the counter 20.

OPERATION OF THE SYSTEM

Upon initialization of the system the various registers and other logic devices are in unknown states. A TLOAD signal (not shown) is used to initialize all the registers and the counter to a known initial state.

The user may program the counter system with an initial terminal count by writing data to the the present latch 16. This is done by establishing the control input signals to the read/write control logic 22 in a write state, and by applying the desired terminal count to the data input bus 10 or a bidirectional I/O bus. The desired terminal count is then latched into the preset latch 16.

Figure 2:
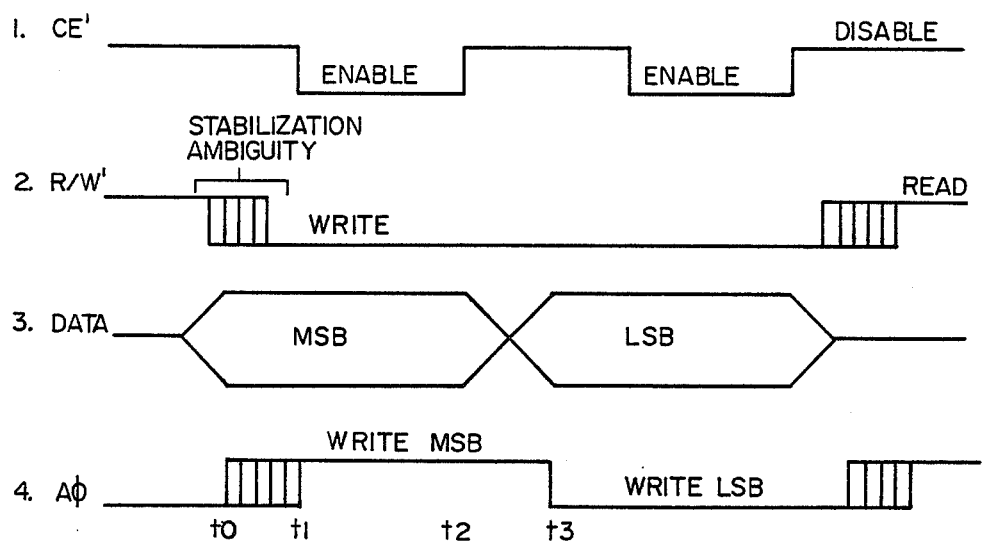
FIG. 2 is a timing diagram of a typical write transaction wherein a new terminal count number is written into the system.

FIG. 2 is a timing diagram of the details of this write transaction. The chip enable signal CE' must be brought low to enable any I/O transaction to the counter system. The read/write control signal R/W' must be brought low to implement a write transaction as shown on time line 2. CE' is not brought low until R/W' has been brought low and is stable, so care must be taken by the user in generating CE' to take into account the stabilization time of R/W' and not bring CE' low until R/W' is stabilized to avoid writing the terminal count into the wrong register as shown on time line 1. After R/W' has been stabilized, and CE' is brought low, the data representing the desired terminal count may be applied to the input bus 10 as shown on time line 3. The WRITE STROBE signal on line 9 will be generated at the time that CE' goes low with R/W' in the low state. For embodiments using byte wide I/O buses with multibyte word sizes for the latches, the signal Ao plays a part in the write transaction as will be described below.

Figure 3:
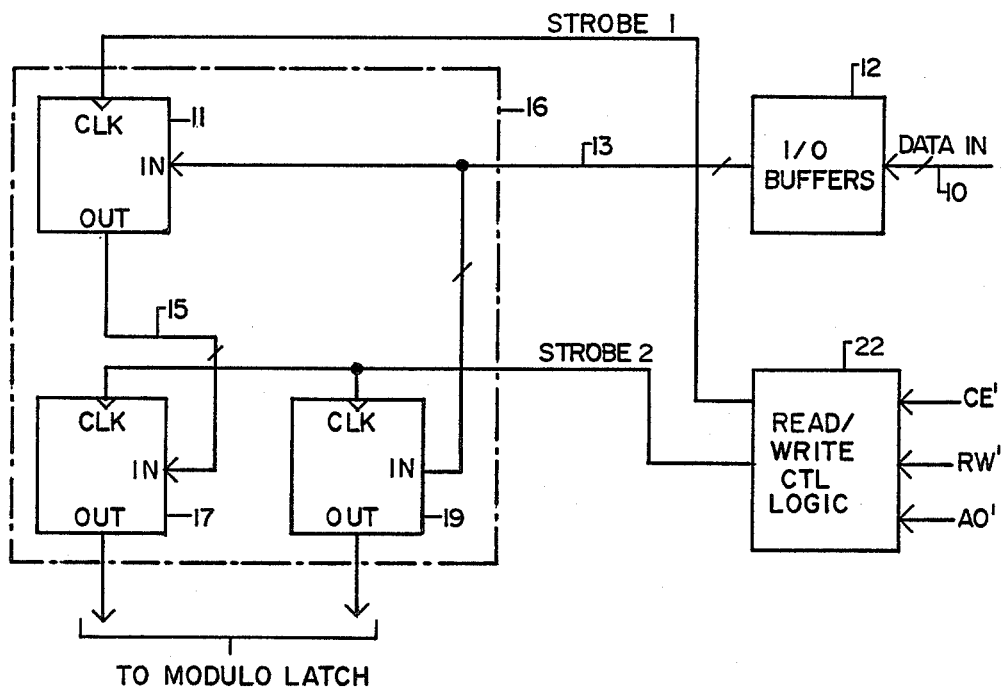
FIG. 3 is a block diagram of the logic of a two level input latch structure where the I/O bus has only half as many bits as can be stored in the input latches.

The control signal Ao is used for embodiments where the number of I/O pins devoted to the data bus is half the number of bits in the preset latch and the snapshot register. Such an embodiment uses the circuitry shown in FIG. 3 for the present latch 16 and uses the circuitry of FIG. 4 for the snapshot register. In FIG. 3, the present latch 16 is comprised of three separate latches, each able to store the number of bits in the input bus 10. A first latch 11 serves as a temporary storage latch to store the most significant byte of the input word after the data on the input bus 10 has made the transition to the bit pattern of the least significant byte. The operation of writing in a new terminal count in the circuit of FIG. 3 involves driving all the signals on time lines 1-3 in FIG. 2 in the manner shown. The data bus 10 is first driven with the bit pattern of the most significant byte (MSB) of the new terminal count, and this pattern is stable by the time t0. The signal STROBE 1 is generated by the logic 22 when CE' and R/W' are both low and A0 goes high. This strobes the most significant byte then present on bus 13 into the latch 11. This data is then present on the output bus 15 of the latch 11 and is stable there for as long as the contents of the latch 11 do not change.

At time t2, the bit pattern on the bus 13 begins to make the transition to the bit pattern of the least significant byte (LSB) of the new terminal count word. By time T3, this bit pattern is stable. The AO signal is then driven low by the user, and this causes the STROBE 2 signal to be generated as long as CE' and R/W' are still low. This causes the bit pattern on the bus 15 to be strobed into the latch 17 and the bit pattern on the bus 13 to be strobed into the the latch 19. This completes the write transaction of a new terminal count word using an I/O bus having only half as many bits as are in the terminal count word being written. Note that this transaction is independent of activity by the counter 20 and is independent of the cycles of the arbitration clock signal ARB CLK. It is therefore asynchronous and can occur any time the above conditions of FIG. 2 occur in the sequence described.

Figure 4:
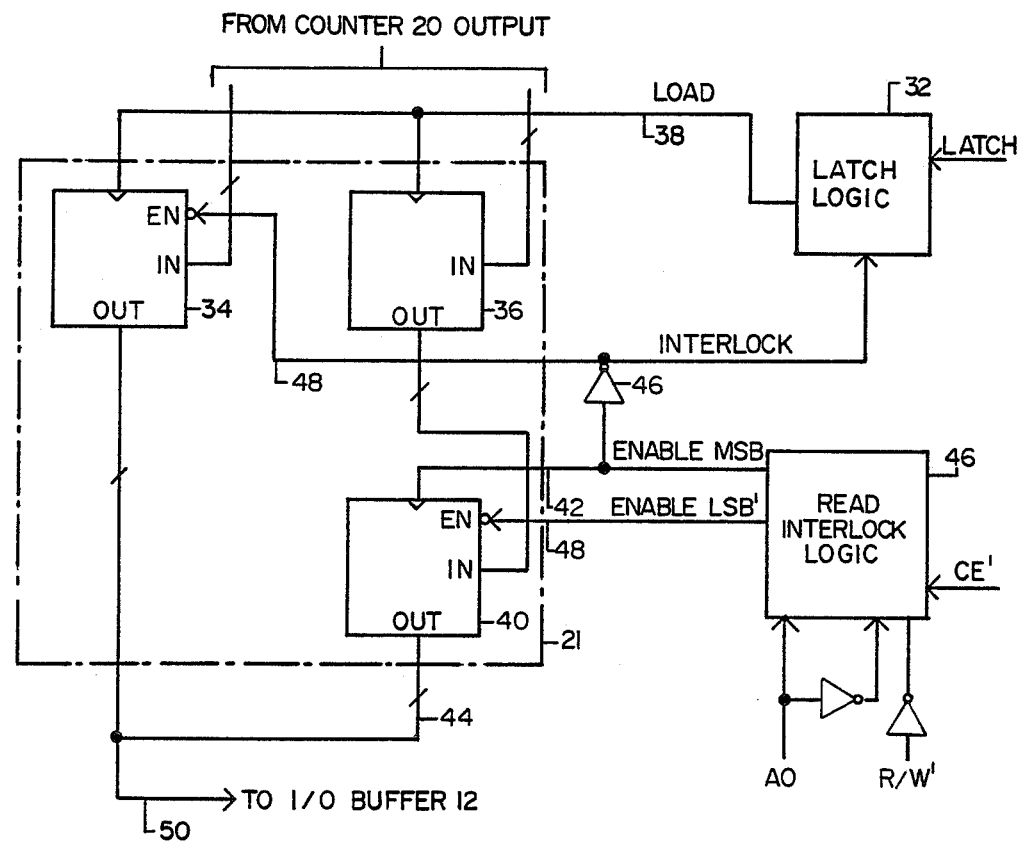
FIG. 4 is a block diagram of the logic of the output latch structure allowing asynchronous reads and snapshots of the current count using an I/O bus having only half as many bits as the snapshot register.

The same type of two cycle operation may be used for reading the contents of the snapshot register 21. FIG. 4 shows the circuitry needed to accomplish such a read operation. The current count output from the counter 20 may be latched into the latches 34 and 36 when the LATCH signal is forced to make an upward transition by the user. This transition causes the latch logic 32 to generate the LOAD signal on a line 38 which clocks the current count into the latches 34 and 36. The exception to this loading occurs when the latch 34 is enabled for a read operation by activation of the ENABLE MSB signal on line 42. This signal causes the latch 34 to be enabled by causing a low on the INTERLOCK signal line 48 which is coupled to the ENABLE MSB signal line 42 through an inverter 46. Enabling the latch 34 causes its output bus 44 to be taken out of the tri state condition and the contents of the latch 34 are presented to the I/O buffer 12. The output bus of latch 34 and the output bus of latch 40 are ganged together and share the same I/O bus lines. Thus only one of the latches 34 and 40 may be enabled at any particular time. To prevent both from being simultaneously enabled, the ENABLE MSB signal is active only when CE' is low and R/W' is high and AO is high indicating the most significant byte is to be read. The enable input of the latch 40 is coupled to the read interlock logic 46 by a signal line 48 carrying the ENABLE LSB' signal. This signal is active low only when CE' is low, R/W' is high and AO is low. Thus because AO can never be in both states at once, the latches 34 and 40 cannot be simultaneously enabled for reading. Note that the clock input of the latch 40 is coupled to the ENABLE MSB signal line 42 such that when the latch 34 is enabled by the user forcing AO high to read the most significant byte, the least significant byte is simultaneously transferred into the latch 40. When the user forces AO low to read the least significant byte, the latch 40 will be enabled and its output bus will assume control of the I/O bus 50 simultaneously with the relinquishing of control of the I/O bus by the latch 34. This way only one of the latches may be enabled for reading at any particular time.

The inverter 46 also has its output coupled to the latch logic 32 as an interlock signal. This signal blocks the generation of the LOAD signal when the latch 34 is enabled for reading. This interlock prevents the loading of new data into the latch 34 at the same time the latch is being read thereby preventing erroneous data from being read because of outputs in transition from one state to another.

Referring to FIG. 1, the new terminal count that has been written by the user into the preset latch is used to control the count boundaries of the counter as follows. The new terminal count stored in the preset latch 16 will be transferred into the terminal count latch 18 in one of three ways. The first way is when the user forces the PRESET signal to make an upward transition. This causes the preset and count logic 24 to generate the TERMINAL COUNT LOAD signal on the line 52 which clocks the data on the bus 54 from the output of the preset latch 16 into the terminal count latch. This preset operation is synchronized with the arbitration clock signal ARB CLK in that the PRESET signal is latched whenever it makes an upward transition, but the latched version of PRESET is not clocked into the latch which actually generates the TERMINAL COUNT LOAD signal until the ARB CLK signal assumes the proper one of its two states. The system of FIG. 1 is synchronized with the arbitration clock in that counting occurs only during one phase or during one state of the clock while other latching, presetting and count direction changing operations are synchronized with the other phase or state of the clock.

At the same time that the TERMINAL COUNT LOAD signal is activated, the preset and count logic 24 activates the GEN LOAD signal on line 56 coupled to the reload logic 30. The activation of the GEN LOAD signal causes the reload logic 30 to activate the LOAD signal on the line 58 coupled to the counter 20. This causes the counter 20 to clock in as the new current count number the current terminal count data stored in the terminal count latch 18 and present on the bus 60 coupled to the output of the terminal count latch 18. Thus the new terminal count formerly stored in the preset latch becomes the current terminal count stored in the terminal count latch 18 and becomes the current count stored in the counter 20.

The other two ways the new terminal count is loaded into the terminal count latch 18 are when the counter 20 counts up to the current terminal count then stored in the terminal count latch 18, and when the counter 20 counts down to zero. The sequence of events which occur when either of these two events occurs will be described next.

The counter 20 is now prepared to either count down from the current count, i.e., the current terminal count or to count up from the current terminal count and be reset to zero. The direction of the counting is controlled by the logic state of the DIR input signal to the preset and count logic 24, while the incrementation or decrementation of the current count number occurs when the COUNT input signal makes an upward transition at the next upward transition of the ARB CLK signal. That is, the COUNT transition is latched into the preset and count logic 24 immediately when it occurs. The latched version of COUNT is then reclocked with the ARB CLK signal and latched into a second latch upon the next upward transition of the ARB CLK signal. The reclocked version of COUNT is then steered by a pair of steering gates having inputs whose logic states depend upon the logic state of the DIR signal to the proper one of the count up or count down inputs of the counter 20.

The DIR signal is latched into a latch in the preset logic 24 upon every upward transition of the COUNT signal. This latched version of DIR is then reclocked with the next upward transition of the ARB CLK signal in another latch in preset logic 24. The Q and Q' outputs of the reclocking latch are then used as the steering input signals to the gates in the preset logic 24 which steer the count signals to the proper inputs of the counter 20. The Q and Q' outputs block the transmission of the count signals to the input of the counter not selected by the DIR signal. If DIR selects the count down direction, the preset logic 24 activates the DOWN 1 signal on line 62 for every COUNT transition where the down direction is selected. Line 62 carries the DOWN 1 pulses to the reload logic which gates them to the count down input of the counter if the BORROW' output signal from the counter 20 on line 64 is inactive (high). The BORROW', signal is active low only when the current count is equal to zero. If BORROW' is inactive, the reload logic activates the DOWN 2 output signal on line 67 coupled to the count down input of the counter every time a DOWN 1 pulse is received on line 62.

If DIR selects the up direction, the preset logic 24 activates the UP 1 signal on line 68 coupled to the clear logic 28. The clear logic 28 gates the UP 1 signal to the count up input of the counter 20 via the UP 2 signal as long as the current count has not reached the current terminal count. When the current count becomes equal to the current terminal count stored in the terminal count latch 18, the EQ input signal on line 66 signals this condition. The EQ signal is generated by the comparator 26 which has its A input coupled to the output of the terminal count latch 18 and its B input coupled to the current count output from the counter 20. When the bit patterns on the A and B buses are the same, the comparator 26 activates the EQ signal.

When the EQ signal is activated, the clear logic 28 blocks passage of the next UP 1 pulse to the count up input of the counter 20 as the UP 2 signal and diverts it to the set input of a latch in the clear logic 28 thereby setting this latch. One output of this latch is used to activate the CLEAR signal on line 70 coupled to the clear input of the counter 20. The CLEAR signal resets the counter 20 to zero, but its generation by the clear logic 28 is blocked if the CLR LOCKOUT signal on line 72 is active. CLR LOCKOUT is active only on initialization and guarantees that a preset operation can always be performed at initialization time regardless of which state the latch which generates the CLEAR signal comes up in initially. The other output of the latch which generates the CLEAR signal is used to activate the TERMINAL COUNT UP' signal on line 27. This signal is converted by gate 29 to the TERMINAL COUNT signal on line 64 and is output for use by successive stages for daisy chain counting. Further, line 74 is coupled to the preset and count logic 24, and causes said logic to activate the TERMINAL COUNT LOAD and the GEN LD signals. These signals cause the loading of the new terminal count in the preset latch 16 simultaneously into the terminal count latch 18 as the current terminal count and into the counter 20 as the current count. The ARB CLK input to the clear logic 28 is used to reclock the generation of the CLEAR and TERMINAL COUNT UP' signals with the proper phase of the arbitration clock.

If the counter counts all the way down through zero, the counter 20 automatically activates the BORROW' output signal on line 64. This signal causes the reload logic 30 to activate the LOAD' signal on the next pulse of the DOWN 1 signal. The activation of LOAD' causes the counter 20 to load the current terminal count on the data bus 60 and stored in the terminal count latch 18. The activation of BORROW' sets a latch in the reload logic 30 one output of which is used to activate the LOAD signal and the other output of which is used to generate the TERMINAL COUNT DN' signal on line 31 coupled to the gate 29. Gate 29 converts TERMINAL COUNT DN' to TERMINAL COUNT on line 74, and TERMINAL COUNT causes loading of the new terminal count in preset latch 16 to be loaded into the terminal count latch 18 and into the counter 20 as the new current count as previously described. The TERMINAL COUNT DN' signal is generated synchronously with the transition to the proper phase of the ARB CLK signal. Thus the loop size, i.e., the numbers between which the counter 20 counts up and down changes each time the counter reaches either zero or the current terminal count and each time the PRESET input signal is forced to make an upward transition.

In some situations it is desirable to be able to have the counter be able to temporarily count past the current terminal count to the maximum count to which the counter may count without resetting to zero. This feature is implemented in the counter of the invention by provision of an input for a BYPASS' signal. When the user wishes the counter to count up and down between zero and its maximum count value, the BYPASS' signal is driven low on line 80 coupled to the disable input of the comparator 26. This disables the comparison such that the EQ signal on line 66 is never activated when the count reaches the current terminal count. The counter is then free to count up and down between the maximum possible count and zero. When the maximum count is reached, the counter 20 resets itself to zero without the aid of the clear logical 28. When zero is reached, the counter 20 activates the BORROW' signal, and the reload logic 30 acts normally to reload the current terminal count.

In situations where the counter is used in servo systems and the possibility of aliasing is present, it is useful to be able to prevent aliasing from occurring by the activation of a control signal accessible to the user system. The MAX-MIN signal on line 82 provides this feature in the counter system of the invention. The MAX-MIN signal, when active causes the clear logic 28 to not generate the CLEAR signal when the EQ signal becomes active and to not generate the TERMINAL COUNT UP' signal. Further, when MAX-MIN is active, the reload logic is prevented from generating the LOAD' and the TERMINAL COUNT DN' signals when the counter 20 counts down to zero and activates BORROW'. Thus, when MAX-MIN is activated, the counter will count to the current terminal count and stop until either MAX-MIN is deactivated or the direction of counting is reversed. The same is true when the count reaches zero, i.e., counting will stop until DIR reverses to its opposite state or until MAX-MIN is deactivated.

Although the invention has been described in terms of the preferred embodiment and alternative embodiments discussed herein, it will be apparent to those skilled in the art that numerous modifications are possible without departing from the true spirit and scope of the invention. All such modifications are intended to be included within the scope of the claims appended hereto.

What is claimed is:

1. A bidirectional counter with programmable terminal count capability comprising:
   an up/down counter for counting up or down in response to count up and count down signals applied respectively to count up or count down inputs;
   first means for storing a current terminal count;
   second means coupled to said first means and to said up/down counter for comparing the current terminal count to the current count in said up/down counter and for clearing the up/down counter to zero when the two numbers are equal and the next count up signal is received;
   third means for causing the current terminal count to be loaded into said up/down counter as the current count in said up/down counter after the current count in said up/down counter becomes equal to zero and the next down count signal is received.

2. A bidirectional up/down counter as defined in claim 1 further comprising fourth means coupled to said second and third means for generating a terminal count signal when said current count in said up/down counter reaches either said current terminal count and the next count up signal is received or when the current count in said up/down counter reaches zero and the next count down signal is received.

3. A bidirectional counter as defined in claim 2 further comprising means coupled to said second and to said third means for receiving a max-min signal and, when said max-min signal is active, for preventing resetting the up/down counter to zero and for preventing the reloading of the current terminal count into said up/down counter as the new current count.

4. A bidirectional counter as defined in claim 2 further comprising means coupled to said means for generating and to said first means for receiving and temporarily storing a new terminal count and, either upon receipt of said terminal count signal or upon receipt of a preset signal, for loading said new terminal count into said first means as the current terminal count and into said up/down counter as the current count.

5. A bidirectional counter as defined in claim 1 further comprising means coupled to said second means for, upon receipt of a bypass signal, preventing said up/down counter from being reset to zero when the current count in said up/down counter equals the current terminal count and the next count up signal is received.

6. A bidirectional counter as defined in claim 1 further comprising means for latching the current count of said up/down counter upon activation of a latch signal provided by the user and for providing the current count in said up/down counter so latched on an input/output bus.

7. A bidirectional counter as defined in claim 2 further comprising means for latching the current count of said up/down counter upon activation of a latch signal provided by the user and for providing the current count in said up/down counter so latched on an input/output bus.

8. A bidirectional counter as defined in claim 3 further comprising means for latching the current count of said up/down counter upon activation of a latch signal provided by the user and for providing the current count in said up/down counter so latched on an input/out bus.

9. A bidirectional counter as defined in claim 4 further comprising means for latching the current count of said up/down counter upon activation of a latch signal provided by the user and for providing the current count in said up/down counter so latched on an input/output bus.

10. A bidirectional counter as defined in claim 5 further comprising means for latching the current count of said up/down counter upon activation of a latch signal provided by the user and for providing the current count so latched on an input/output bus.

11. A bidirectional counter with programmable terminal count capability comprising:
an up/down counter for counting up or down in response to up count and down count signals applied respectively to count up or count down inputs;
first means for storing a current terminal count;
second means coupled to said first means and to said up/down counter for comparing the current terminal count to the current count in said up/down counter and for clearing the up/down counter to zero when the two numbers are equal and the next up count is reached; and
third means coupled to said first means, said third means for receiving at any time during the current count in said up/down counter and temporarily storing a new terminal count from a user and for causing the current terminal count to be loaded into said first means and into said up/down counter as the current count when the current count in said up/down counter equals zero and the next count down signal is received and for loading the new termianl count as the current terminal count into said first means when the up/down counter is loaded with the current terminal count.

12. The apparatus of claim 11 further comprising means for allowing the direction of counting to be changed at any time.

13. The apparatus of claim 11 further comprising means for allowing the direction of counting to be changed at any time by converting a count signal and a direction signal into said count up or count down signals as defined by the state of said direction signal at the time of receipt of said direction signal.

14. An up/down counter with a programmable terminal count comprising:
first means for counting up from zero upon receipt of count up signals at a count up input and for counting down from the current count in said up/down counter or from a stored terminal count upon receiving count down signals at a count down input and for generating a borrow signal when the count reaches zero and for storing a terminal count as the current count in said up/down counter upon receipt of a load signal;
second means for receiving count and direction signals and for causing said first means to count up or count down in response thereto;
third means for receiving a new terminal count at any time and storing it;
fourth means coupled to said third means for receiving and storing said new terminal count upon receipt of a terminal count load signal and storing it as the current terminal count;
fifth means for comparing said current terminal count to the current count in said up/down counter of said first means and for generating an equal signal when the current count in said up/down counter equals the current terminal count;
sixth means for receiving said equal signal and for clearing said first means to a zero count upon receipt of the next count up signal and for generating said terminal count load signal at the same time; and
seventh means for receiving said borrow signal and for causing the terminal count stored in said third means to be stored in said fourth means and to generate said load signal for transmission to said first means upon receipt of the next count down signal.

15. A bidirectional counter with programmable terminal count which can be changed at any time comprising:
first means for receiving at any time and storing a terminal count;
second means coupled to said first means for receiving and storing said terminal count upon receipt of a terminal count load signal and for presenting said terminal count as the current terminal count at an output;
an up/down counter having a preset input coupled to said second means output and having count up and count down inputs for receiving predetermined signals to cause said up/down counter to count up or count down from its current count in said up/down counter depending upon which input receives said signals and having a count output for outputting the current count in said up/down counter and having a clear input for receiving a clear signal to clear the current count in said up/down counter to zero and having a borrow output for outputting a borrow signal when the count reaches zero and the next count down signal is received at said count down input and having a load input for receiving a load signal to cause said current terminal count to be loaded into said up/down counter as the current count in said up/down counter;

third means coupled to said count up and said count down inputs and to said second means for receiving a count input signal and a direction input signal and a preset signal for steering said count signal to either the count up or the count down input depending upon the logic state of the direction signal, and having a terminal count input, and for generating said terminal count load signal and transmitting same to said second means upon receipt of a terminal count signal at said terminal count input or upon receiving said preset signal and for generating a generate load signal upon receipt of said preset signal;

fourth means having a first input coupled to the output of said second means and having a second input coupled to said count output of said up/down counter for generating said terminal count signal at an output coupled to said terminal count input of said third means when the count of said up/down counter equals the terminal count at the output of said second means and the next count up signal is received and for generating and transmitting to said up/down counter said clear signal when the count equals said terminal count count and the next count up signal is received; and fifth means coupled to receive said borrow signal from said up/down counter and said generate load signal from said third means and for generating said load signal and transmitting it to said load input of said up/down counter upon receipt of either said generate load signal or said borrow signal and for generating said terminal count signal upon receipt of said borrow signal.

16. A bidirectional counter comprising:
an up/down counter;
means for receiving count signals and applying them to said up/down counter so as to cause it to count either up or down; and
means coupled to said up/down counter to allow the current count in said up/down counter to be stored at any time for later reading upon receipt of a predetermined control signal;
means for allowing the modulo count of said up/down counter to be changed at will.

17. The apparatus of claim 16 further comprising means for allowing the count stored upon receipt of said predetermined control signal to be read at any time except when said predetermined control signal is active and the new value of the current count in said up/down counter is being stored.

18. A method of counting up or down using an up/down counter between a programmable terminal count and zero comprising the steps of:
monitoring an input for the presence of a new terminal count and storing said new terminal count in a memory when said new terminal count appears;
storing a current terminal count in a memory;
monitoring a count input and a direction input for signals indicating when to change the current count in said up/down counter and whether to increment or decrement the current count in said up/down counter;
incrementing or decrementing the current count in said up/down counter in response to said monitored signals;
generating a borrow signal when the current count in said up/down counter equals zero;
comparing the current count in said up/down counter to said current terminal count stored in said memory;
transferring said new terminal count into the memory location storing said current terminal count and setting the current count in said up/down counter to the value of the new terminal count just transferred when the current count in said up/down counter equals zero; and
transferring said new terminal count into the memory location storing said current terminal count and setting the current count in said up/down counter to zero when the current count in said up/down counter equals the current terminal count.

19. The method of claim 18 further comprising the steps of monitoring an input for the activation of a latch signal and storing the current count in said up/down counter as it stands at the time of activation of said latch signal and generating a terminal count signal when the current count in said up/down counter reaches either zero or the current terminal count.

20. The method of claim 19 further comprising the step of monitoring an input for the activation of a max-min signal and preventing either further counting up or resetting to zero or generation of the terminal count signal when the current count in said up/down counter reaches the current terminal count and preventing either further counting down or reloading the up/down counter with the current terminal count or generating the terminal count signal when the current count in said up/down counter reaches zero.

21. The method of claim 20 further comprising the step of monitoring an input for the activation of a bypass signal and for preventing the current count in said up/down counter from being reset to zero when the current count in said up/down counter equals the current terminal count when said bypass signal is active.

22. A counter capable of having its count value at any instant in time read asynchronously at any other instant in time comprising:
a counter;
means for receiving count signals and applying them to said counter so as to cause it to count either up or down depending upon the desired direction of counting; and
means coupled to said counter to allow the current count in said counter to be stored at any time for later reading upon receipt of a predetermined control signal.

23. A counter comprising:
a counter;
first means for receiving count signals and applying them to said counter so as to cause it to count up; and
second means for storing a programmable terminal count;

third means for receiving at any time a new terminal count and for temporarily storing same until it can be transferred to said second means;

fourth means for comparing the current count of said counter to said programmable terminal count stored in said second means and for causing the new terminal count stored in said third means to be transferred from said third means to said second means for storage and for causing said counter to be reset to zero when the current count in said counter equal the current terminal count and the next count signal is received.

24. A anti aliasing counter comprising:

a counter;

first means for receiving count signals and applying them to said counter so as to cause it to count up; and second means for storing a programmable terminal count;

third means for comparing the current count of said counter to said programmable terminal count stored in said second means and for causing said counter to be reset to zero when the current count in said counter equals said programmable terminal count and the next count signal is received;

fourth means coupled to said third means for receiving a max-min signal and, when said max-min signal is active, for preventing resetting the counter to zero when said terminal count is reached and the current count to be maintained at the current value of said terminal count.

25. A counter with a programmable terminal count and the ability to bypass said terminal count comprising:

a counter;

first means for receiving count signals and applying them to said counter so as to cause it to count up; and second means for storing a programmable terminal count;

third means for comparing the current count of said counter to said programmable terminal count and for causing said counter to be reset to zero when the current count in said counter equals the current value of said programmable terminal count and the next count signal is received;

fourth means coupled to said third means for receiving a bypass signal and, when said bypass signal is active, for preventing resetting the counter to zero and allowing counting to proceed to the maximum count which the counter can represent at its output.

* * * * *

UNITED STATES PATENT AND TRADEMARK OFFICE
CERTIFICATE OF CORRECTION

PATENT NO. : 4,713,832
DATED : December 15, 1987
INVENTOR(S) : John Hutson

It is certified that error appears in the above-identified patent and that said Letters Patent is hereby corrected as shown below:

Column 3, lines 42-44, delete "from the first level of the input latch structure into the preset input of the up/down counter";
Column 5, line 65,
change "present" to --preset--;
Column 6, line 20, change "Ao" to --AO--;
line 22, change "Ao" to --AO--;
line 26, change "present" to --preset--;
line 27, change "present" to --preset--;
Column 11, line 37, change "out" to --output--.

Signed and Sealed this

Sixteenth Day of August, 1988

Attest:

DONALD J. QUIGG

*Attesting Officer*      *Commissioner of Patents and Trademarks*